United States Patent [19]

Lemaitre

[11] Patent Number: 4,566,557

[45] Date of Patent: Jan. 28, 1986

[54] FLAT ACOUSTIC DIFFUSER

[76] Inventor: Guy Lemaitre, 7 Chemin de la Foux Le Revest des Eaux, 83200 Toulon, France

[21] Appl. No.: 588,008

[22] Filed: Mar. 9, 1984

[30] Foreign Application Priority Data

Mar. 9, 1983 [FR] France ................................ 83 04176

[51] Int. Cl.⁴ ................................................ H05K 5/00

[52] U.S. Cl. .................................... 181/150; 181/155; 181/156

[58] Field of Search ............... 181/144, 145, 147, 150, 181/154-156, 168, 148

[56] References Cited

U.S. PATENT DOCUMENTS

| | | | |
|---|---|---|---|
| 3,179,202 | 4/1965 | Cole et al. | 181/147 |
| 3,696,885 | 10/1972 | Grieg et al. | 181/148 X |
| 3,767,005 | 10/1973 | Bertagni | 181/160 |
| 3,938,617 | 2/1976 | Forbes | 181/155 |
| 4,029,170 | 6/1977 | Phillips | 181/155 |
| 4,296,280 | 10/1981 | Richie | 181/156 X |

FOREIGN PATENT DOCUMENTS

| | | |
|---|---|---|
| 541351 | 10/1955 | Belgium . |
| 388364 | 8/1930 | France . |
| 1308448 | 9/1962 | France . |
| 1497849 | 10/1967 | France . |

*Primary Examiner*—Benjamin R. Fuller

*Attorney, Agent, or Firm*—Sandler & Greenblum

[57] ABSTRACT

An acoustic device including a frame bordering an area open to the front and rear of the frame, a speaker corresponding in size to the area bordered by the frame located with the area bordered by the frame, a cover positioned over only the front of the acoustic device functioning as a direct wave attenuator so that the front side of the speaker is covered but its rear side is uncovered so that unattenuated sound waves are emitted from the rear of the speaker.

13 Claims, 3 Drawing Figures

FLAT ACOUSTIC DIFFUSER

BACKGROUND OF THE INVENTION

1. Field of the Invention

The present invention relates to audio instruments, including baffles and acoustic enclosures, which permit the broadcasting of audio reproductions.

2. Discussion of Relevant Materials

Most conventional acoustic devices are of the enclosure type wherein the transducers or loudspeakers are inserted in a wall of a closed box or cabinet. Such an arrangement results with an acoustic constraint or load due to the absorption of sound waves emitted from the front of the speaker by the recess at its rear. It is believed that this prevents acoustic short-circuiting ow what is more commonly referred to as dampening of the sound waves.

In other devices, the number and arrangement of the loudspeakers, the form of the box or cabinet enclosing the speaker, as well as its interior arrangement, may differ, but the principal of an acoustic load in the rear of the loudspeaker remains substantially the same. Nevertheless, the counter-reactions or dampening effect of the reflection of sound waves in the listening room on the membrane of the loudspeaker poses a persistent problem. Included among the unsatisfactory effects of such conventional systems are the alteration of the audio broadcast of the sound emitted from the speaker enclosure or the sound of the box, in addition to what is referred to as coloration of the sound itself. Moreover, the means employed in an attempt to improve such problems are cumbersome, esthetically mediocre, and expensive.

SUMMARY OF THE INVENTION

The acoustic diffuser or device according to the present invention is an original and inexpensive solution to these various problems.

It is an object of the present invention to provide a frame for a speaker which assures a maintenance of low frequencies and prevents static vibrations.

It is another object of the present invention to provide a cover for the frame and speaker in the form of a decorative panel. It is a further object of the present invention to provide a cover which constitutes a front acoustic load and a direct wave attenuator.

It is a still further object of the present invention to attach the acoustic device to the wall of a listening room so as to position it at a plane angle in order to make it possible to receive attenuated sound waves from the front of the device and twice-reflected waves from the rear thereof, thereby eliminating the counter-reactions or dampening effect due to the reflections of sound waves in the room.

It is yet another object of the present invention to provide an acoustic device includng one or more loudspeakers which may be either the dynamic type or the electrostatic type but, in either case are dipolar.

It is still yet another object of the present invention to provide a pair of properly positioned acoustic devices or diffusers which are operated in well-balanced stereo so as to simulate the impression felt in a concert hall.

It is yet an additional object of the present invention to provide an acoustic device whose structure does not adversely affect the esthetics thereof, and preferably one which includes a decorative element which is surrounded by a frame to simulate a painting.

DETAILED DESCRIPTION OF THE INVENTION

Figure 1:
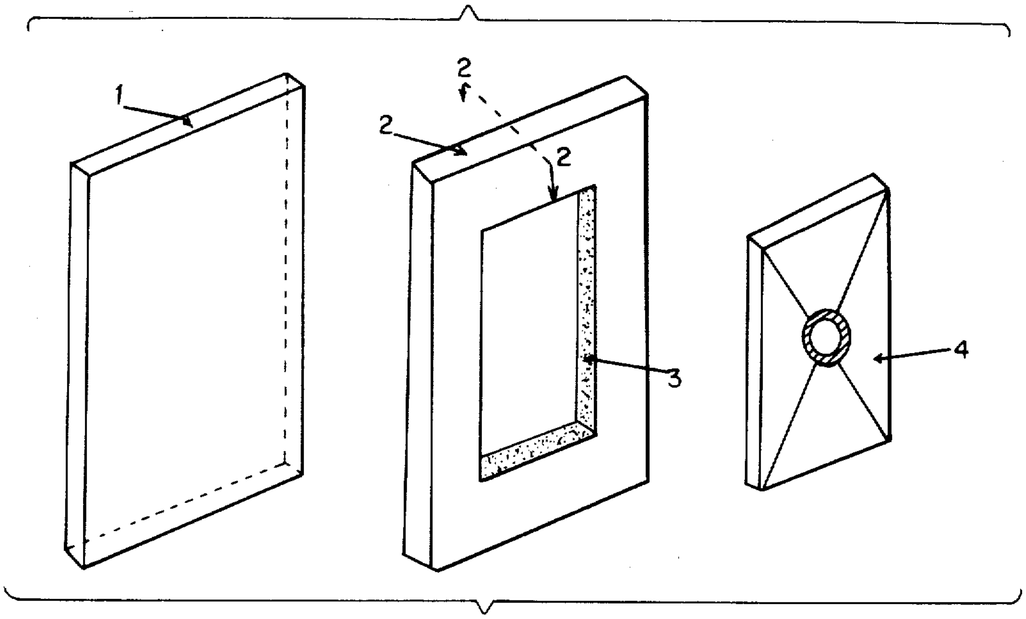
FIG. 1 of the annexed drawings presents an exploded view of the acoustic device.
Figure 2:
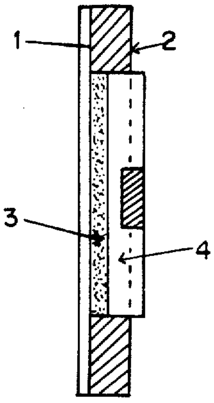
FIG. 2 shows a cross-sectional view of the acoustic device.

As shown in the drawings, the acoustic device or apparatus includes a cover or panel 1 positioned over the front of a frame 2 into which is cut an area open to the front and rear of the frame, i.e., a window 3, within which a planar loudspeaker 4 having dimensions corresponding to the open area of the frame, and operating as a dipole is inserted or located.

Figure 3:
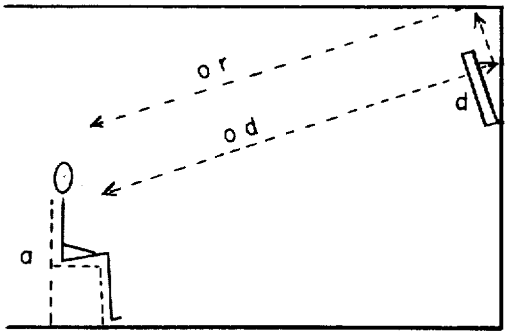
FIG. 3 illustrates schematically the positioning of the acoustic device or apparatus in the listening room relative to a listener.

In FIG. 3, the acoustic device or apparatus of the present invention, depicted as element d, is shown as diffusing or emitting a direct wave (od) and a reflected wave (or) towards the listener a.

As used herein a wave attenuator is an element which functions to reduce the amplitude and frequency of sound waves propulgated by the diaphram of the speaker. This is accomplished by filtering the sound waves to permit the high frequency to pass directly through the front panel while reflecting lower frequency waves propulgated by the diaphram rearwardly off the panel and then the support and wall with which the acoustic device is associated.

The acoustic device or apparatus, in conformance of the objects of the present invention, is capable of being used in those situations where one desires a high-quality and esthetically pleasing acoustic diffuser or device, particularly one having an exterior appearance simulating a painting.

From the foregoing description, one skilled in the art can easily ascertain the essential characteristics of this invention and, without departing from the spirit and scope thereof, can make various changes and modifications of the invention to adapt it to various usages and conditions.

I claim:

1. An acoustic device comprising:

a frame bordering an area open to the front and rear of the frame;

a speaker located within the area bordered by the frame, said speaker corresponding in size to said area and having a front side and a rear side;

a cover positioned over only the front of the acoustic device so that said front side is covered and said rear side is uncovered, said cover being a direct wave attenuator whereby unattenuated sound waves are emitted from the rear side of the speaker.

2. An acoustic device in accordance with claim 1, wherein the speaker is a dipole speaker.

3. An acoustic device in accordance with claim 2, wherein the speaker is a dynamic speaker.

4. An acoustic device in accordance with claim 2, wherein the speaker is an electrostatic speaker.

5. An acoustic device in accordance with claim 2, wherein the speaker is planar.

6. An acoustic device in accordance with claim 5, wherein dimensions of the speaker include depth which does not extend beyond the area bordered by said frame.

7. An acoustic device in accordance with claim 4, wherein said cover is a decorative panel.

8. An acoustic device in accordance with claim 7, wherein the panel constitutes an acoustic load.

9. An acoustic device in accordance with claim 4, further comprising a support and a means for attaching the rear of the frame to said support.

10. An acoustic device in accordance with claim 9, wherein said support is a wall.

11. An acoustic device in accordance with claim 10, wherein said wall is an element of a chamber having a ceiling adjacent said wall.

12. An acoustic device in accordance with claim 11, wherein said frame is attached to said wall on an angle whereby sound waves are diffused directly away from the front of the acoustic device and sound waves are reflected away from the rear of the acoustic device first off the wall and then off the ceiling toward the center of the chamber.

13. An acoustic device comprising:

(a) a frame bordering a three-dimensional area open to the front and rear of the frame in the form of a window;

(b) a dipole, planar speaker having a front side and a rear side located within said area bordered by the frame, said speaker having dimensions corresponding to the length, width and depth of said three-dimensional area so that the speaker does not extend beyond said area bordered by said frame;

(c) a cover positioned over only the front of the acoustic device so that said front side is covered and said rear side is uncovered, said cover functioning as a direct wave attenuator so that attenuated sound waves are emitted to the front of the acoustic device and unattenuated sound waves are emitted from the rear of the speaker.

* * * * *

UNITED STATES PATENT AND TRADEMARK OFFICE
CERTIFICATE OF CORRECTION

PATENT NO. : 4,566,557

DATED : January 28, 1986

INVENTOR(S) : Guy GABRIEL and Yves LEMAITRE

It is certified that error appears in the above-identified patent and that said Letters Patent is hereby corrected as shown below:

column 1, line 17, change "ow" to ---or--- after "short-circuiting";

Column 1, line 23, change "principal" to ---principle---.

Column 1 line 47, begin a new paragraph with the following: ---It is a further object...---;

column 1, line 59, change "includng" to ---including-- after "acoustic device".

column 1, line 61, insert a ---,--- before "but" and delete the "," after "but";

column 2, line 25, change "towards" to ---toward---;

column 2, line 28, change "propulgated" to ---promulgated---;

UNITED STATES PATENT AND TRADEMARK OFFICE

CERTIFICATE OF CORRECTION

PATENT NO. : 4,566,557

DATED : January 28, 1986

INVENTOR(S) : Guy Gabriel and Yves Lemaitre

It is certified that error appears in the above-identified patent and that said Letters Patent is hereby corrected as shown below:

Column 2, line 33, change "with" to --within-- after "and wall".

Signed and Sealed this

Twenty-first Day of June, 1988

Attest:

DONALD J. QUIGG

*Attesting Officer*

*Commissioner of Patents and Trademarks*